(12) United States Patent
Cooper et al.

(10) Patent No.: US 12,061,235 B2
(45) Date of Patent: Aug. 13, 2024

(54) SYSTEM AND METHOD FOR SHARED HYBRID TRANSFER SWITCH SYSTEM WITH INTEGRATED RELAY SELF TEST

(71) Applicant: Vertiv Corporation, Westerville, OH (US)

(72) Inventors: Scott Cooper, Lincoln, NE (US);
Kevin R. Ferguson, Dublin, OH (US);
Grant Young, Lincoln, NE (US);
Anthony Bryan McDonald, Lewis Center, OH (US)

(73) Assignee: Vertiv Corporation, Westerville, OH (US)

( * ) Notice: Subject to any disclaimer, the term of this patent is extended or adjusted under 35 U.S.C. 154(b) by 202 days.

(21) Appl. No.: 17/459,837

(22) Filed: Aug. 27, 2021

(65) Prior Publication Data

US 2021/0389375 A1    Dec. 16, 2021

Related U.S. Application Data

(63) Continuation-in-part of application No. 16/867,306, filed on May 5, 2020, now Pat. No. 11,171,508.
(Continued)

(51) Int. Cl.
*G01R 31/327*    (2006.01)
*H01H 9/54*    (2006.01)
*H02J 3/00*    (2006.01)

(52) U.S. Cl.
CPC ......... *G01R 31/3278* (2013.01); *H01H 9/542* (2013.01); *H02J 3/0073* (2020.01); *H01H 2009/544* (2013.01); *H01H 2009/546* (2013.01)

(58) Field of Classification Search
CPC .......... H02J 9/062; H02J 9/068; H02J 3/0073; H02J 3/007; H01H 47/002–005; H01H 2047/003; G01R 31/327–3336
See application file for complete search history.

(56) References Cited

U.S. PATENT DOCUMENTS

| 5,210,685 A | 5/1993 | Rosa |
| 5,644,175 A | 7/1997 | Galm |

(Continued)

FOREIGN PATENT DOCUMENTS

| CN | 102751779 A | 10/2012 |
| DE | 102011005563 A1 | 9/2012 |
| EP | 2681825 A2 | 1/2014 |

OTHER PUBLICATIONS

Product Specification. TwinSource Dual Cord Converter DCC-I MagLatch RMATS automatic transfer switches. Rack Mount Automatic Transfer Switch, published at least one day prior to Aug. 27, 2021, 2 pages.
(Continued)

*Primary Examiner* — Rexford N Barnie
*Assistant Examiner* — Rasem Mourad
(74) *Attorney, Agent, or Firm* — HARNESS, DICKEY & PIERCE, P.L.C.

(57) ABSTRACT

The present disclosure relates to a shared transfer switching system with built in relay testing ability, for transferring power received by a load from a preferred AC power source to an alternate AC power source, or transferring power being received by the load from the alternate AC power source to the preferred AC power source. The system selectively controls various ones of the relays used to apply power from either the preferred or alternate power sources to the load, such that the relays are switched from open to closed states at controlled times, while voltage measurements are made at select locations between the relays. The system can identify
(Continued)

which specific ones of a plurality of relays associated with each of the preferred and alternate power sources has properly opened and closed, and thus verify that all of the relays needed to switch between the preferred and alternate power sources are operating properly.

16 Claims, 10 Drawing Sheets

Related U.S. Application Data

(60) Provisional application No. 62/843,884, filed on May 6, 2019.

(56) References Cited

U.S. PATENT DOCUMENTS

| | | | |
|---|---|---|---|
| 5,699,218 A | | 12/1997 | Kadah |
| 5,814,904 A | | 9/1998 | Galm |
| 6,297,569 B1 * | | 10/2001 | Bartels ............... H01H 47/005 |
| | | | 307/140 |
| 6,465,911 B1 * | | 10/2002 | Takeda ................ H02J 9/062 |
| | | | 307/115 |
| 7,352,082 B2 | | 4/2008 | Marwali et al. |
| 7,405,910 B2 | | 7/2008 | Maitra et al. |
| 7,459,804 B2 | | 12/2008 | Marwali et al. |
| 7,535,129 B2 | | 5/2009 | Phelps et al. |
| 7,932,635 B2 | | 4/2011 | Shenoy et al. |
| 7,960,862 B2 | | 6/2011 | Smith et al. |
| 8,416,592 B2 | | 4/2013 | Zhang et al. |
| 8,508,890 B2 | | 8/2013 | Zheng et al. |
| 8,699,253 B2 | | 4/2014 | Zhang et al. |
| 8,928,184 B2 | | 1/2015 | Ganesan |
| 9,467,006 B2 | | 10/2016 | Dickerson et al. |
| 9,484,771 B2 | | 11/2016 | Braylovskiy et al. |
| 9,520,874 B2 | | 12/2016 | Bush et al. |
| 9,537,348 B2 | | 1/2017 | Bertuzzi et al. |
| 9,627,924 B2 | | 4/2017 | Larson |
| 9,754,745 B2 | | 9/2017 | Suchoff |
| 9,876,390 B2 | | 1/2018 | Bush et al. |
| 2006/0006742 A1 | | 1/2006 | Galm |
| 2006/0269186 A1 | | 11/2006 | Frame et al. |
| 2007/0018506 A1 * | | 1/2007 | Paik ..................... H02J 9/06 |
| | | | 307/115 |
| 2007/0121257 A1 | | 5/2007 | Maitra et al. |
| 2010/0264743 A1 | | 10/2010 | Jung et al. |
| 2012/0106021 A1 | | 5/2012 | Suchoff |
| 2012/0299381 A1 | | 11/2012 | Larson |
| 2014/0097850 A1 * | | 4/2014 | Law ..................... H01H 13/70 |
| | | | 324/415 |
| 2014/0269860 A1 * | | 9/2014 | Brown .................. H04B 3/54 |
| | | | 375/229 |
| 2015/0029762 A1 * | | 1/2015 | Lu ..................... H02M 3/33523 |
| | | | 363/21.17 |
| 2015/0123473 A1 * | | 5/2015 | Braylovskiy ......... H02J 1/102 |
| | | | 307/64 |
| 2016/0056632 A1 | | 2/2016 | Hansson et al. |
| 2016/0197483 A1 | | 7/2016 | Steinert et al. |
| 2018/0026570 A1 | | 1/2018 | Cairoli et al. |
| 2018/0106698 A1 * | | 4/2018 | Karg ..................... F16K 37/0091 |
| 2020/0358309 A1 | | 11/2020 | Ferguson |

OTHER PUBLICATIONS

Brochure. Ablerex Automatic Transfer Switch (ATS), published at least one day before Aug. 27, 2021, 2 pages.
Product Specification. Liebert LTS Load Transfer Switch, published at least one day prior to Aug. 27, 2021, 2 pages.
Product Description. Raritan Intelligent Rack Transfer Switch, published at least one day prior to Aug. 27, 2021, 2 pages.
Product Overview and Specification. APC Automatic Transfer Switch AP4452, Jul. 2020, 2 pages.
Product Description. Tripp Lite Single-Phase Switched Automatic Transfer Switch, Tripp Lite published at least one day prior to Aug. 27, 2021, 2 pages.
Production Description. Geist Rack Power Distribution Unit, at least one day prior to Aug. 27, 2021, 17 pages.
User Manual. Emerson Network Power MPH2 Rack PDU, Liebert Corporation, 2016, 51 pages.
International Search Report and Written Opinion regarding International Application No. PCT/US2020/031677 dated Jul. 13, 2020.
Shukla, Anshuman et al. "A Survey on Hybrid Circuit-Breaker Topologies", IEEE Transactions on Power Delivery, vol. 30, No. 2, Apr. 2015, pp. 627-241.
International Search Report and Written Opinion in corresponding International Application No. PCT/US2022/035213 dated Oct. 21, 2022.
Chinese Office Action including Search Report issued in Chinese Patent Application for Invention No. 202080033983.2 issued Sep. 27, 2023, 5 pages.

* cited by examiner

3-Phase Delta AC Power
Source Configuration

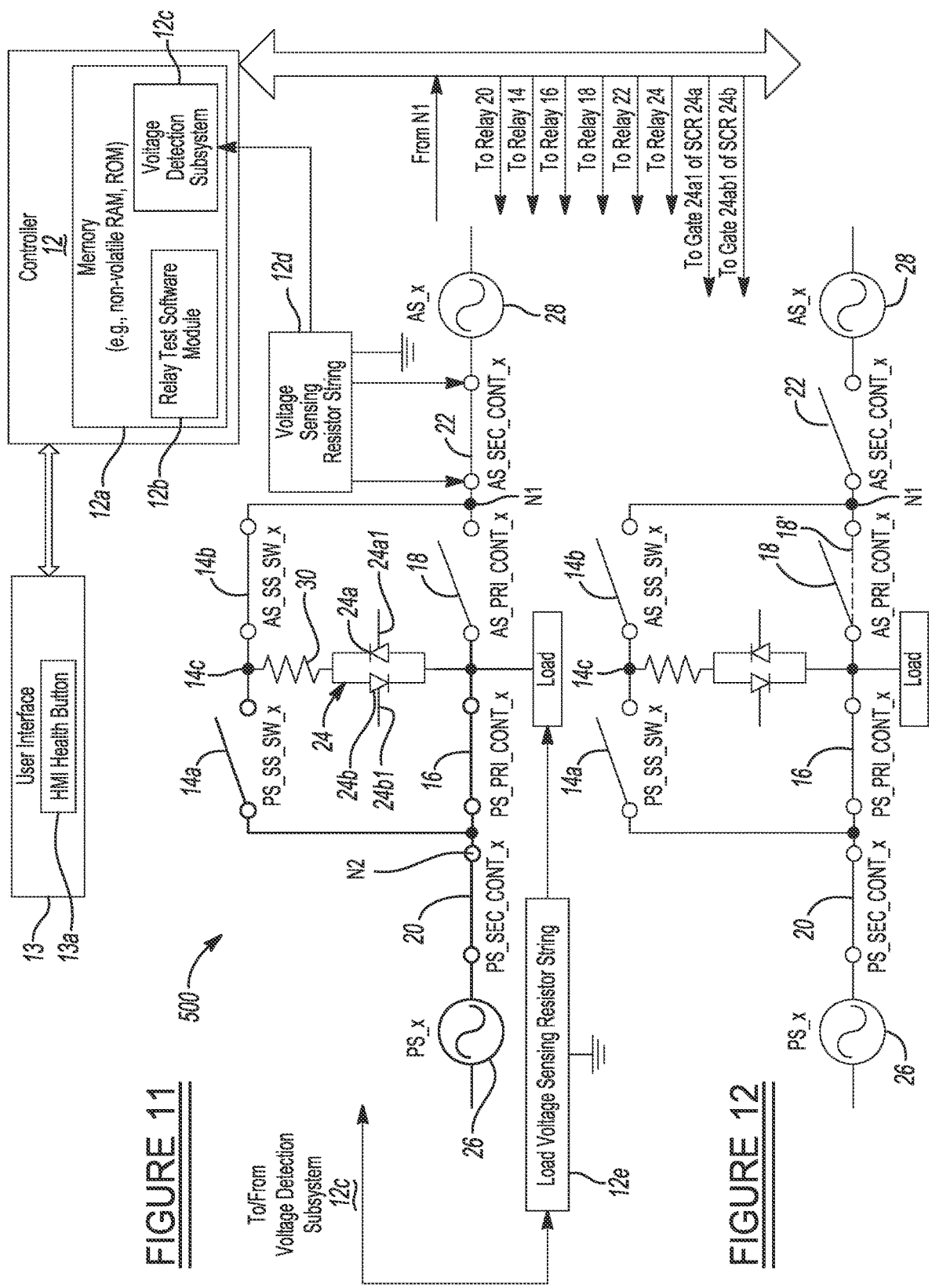

SYSTEM AND METHOD FOR SHARED HYBRID TRANSFER SWITCH SYSTEM WITH INTEGRATED RELAY SELF TEST

CROSS-REFERENCE TO RELATED APPLICATIONS

This application is a continuation-in-part of U.S. application Ser. No. 16/867,306, filed May 5, 2020, presently pending, which in turn claims the benefit of U.S. Provisional Application No. 62/843,884, filed on May 6, 2019. The entire disclosures of the above referenced applications are incorporated herein by reference.

FIELD

The present disclosure relates to transfer switches used in data centers and other facilities to transfer power being supplied to one or more loads from one power source to a different power source, and more particularly to a shared, hybrid transfer switch system which enables the switching time to be significantly reduced when transferring a load from a first power source to a second power source.

BACKGROUND

This section provides background information related to the present disclosure which is not necessarily prior art.

In various types of facilities, and particularly in modern day data centers, a transfer switch is used to reliably facilitate switching of the downstream power distribution infrastructure between two independent power sources (e.g., utility or "preferred" power source and a backup or "alternate" power source) so that uninterrupted operation of the connected equipment (e.g., servers, routers, etc.) is maintained. The transfer may occur automatically when suboptimal power quality conditions are detected on the active source. The transfer may also be initiated manually by a worker at the facility when maintenance of the active power source is required.

The transfer switch is manufactured in a variety of physical forms, performance capabilities, and range of ampacities for single and three-phase power distribution. In data center applications, the transfer switch is preferably located within an equipment rack (i.e., within the rack "space"). It supplies input either directly to IT equipment, via its own receptacles, or to other rack power distribution equipment (e.g., power strips).

The transfer switch's electrical switching uses contacts of electromechanical relays that are electrically interconnected in series and parallel combination. During transfer, these relays are precisely controlled to open the electrical circuit between the previously active source and load, and to quickly close the new circuit for the newly active source, while ensuring that the two sources remain electrically isolated from each other. The sequence can be "break-before-make", in which the active contacts are opened before the new contacts are closed (also referred to as an "open transition"), or "make-before-break", in which the new contacts are closed before the previous contacts are opened (also referred to as "closed transition"). The voltage phasing of the new power source and load may be unsynchronized for open transition or, in the case of closed transition, must be synchronized.

The Information Technology Industry Council ("ITIC") Computer and Business Equipment Manufacturers Association ("CBEMA") Curve describes the AC input voltage envelope that can be tolerated by an IT load with no interruption in function. Transfer switching performance should at least conform to the maximum limits of this Curve, i.e., faster than 20 ms at 70% voltage. For greater market competitiveness, transfer should complete within one-half line cycle, i.e., less than or equal to 8 ms at 60 Hz line frequency. However, typical electromechanical relay contacts operate at release and closure times that cannot achieve such performance for an open transition. Further, reliable detection of power quality conditions and management of the transfer to prevent cross conduction of sources or failure of components typically result in additional incremental delays, which make it difficult or impossible to meet this one-half line cycle transfer timeframe.

To achieve faster transfer time, switching performance of the relay's contacts may be enhanced by use of a solid-state switching device, for example, a TRIAC (bidirectional/bilateral triode thyristor), anti-parallel SCR (silicon-controlled rectifier) pairs, or an IGBT (insulated-gate bipolar transistor). Solid-state relays have previously been used in combination with electromechanical relays in hybrid switching configurations. In these hybrid solutions, terminals of the solid-state switches are permanently electrically connected in parallel with the relay contacts, such that a dedicated solid-state switch is required for both first and second power sources. However, solid-state switches require more parts as well as expensive isolated drive circuitry. Accordingly, a circuit design that reduces the number of solid-state switches would reduce cost and simplify the transfer circuit.

It is also known that the internal power supply of some IT equipment can cause large in-rush currents to flow through the transfer circuits during cold starts (i.e., at power cycle), due to the capacitors being discharged and having low input capacitive reactance. The magnitude of in-rush current can exceed the rating of the relay contacts by an order of magnitude and, if not properly mitigated, can damage or destroy the relay contacts and possibly cause an energy hazard. Accordingly, a circuit design feature which enables a "soft start", which momentarily reduces or limits the in-rush current through the transfer switching circuit when switching from one power source to another, would be extremely valuable in protecting the electronic components of the transfer circuit.

Still further, it would be highly desirable with a system as described above to be able to check the various relays associated with both of the preferred and alternate power sources to verify that each is opening and closing properly. It would also be highly advantageous if the various relays could be checked without the need to add in additional switching components, dummy loads, etc., to carry out the needed tests. Still further, it would be very desirable if the tests on the relays associated with the alternate power source could be carried out without requiring interruption of the preferred power source when the preferred power source is powering the load. Likewise, it would be highly desirable if the relays associated with the preferred power source could each be checked while the load is being powered from the alternate power source, and without interrupting power from the alternate power source to the load.

SUMMARY

This section provides a general summary of the disclosure, and is not a comprehensive disclosure of its full scope or all of its features.

In one aspect the present disclosure a shared transfer switching system with built in relay testing ability, for transferring power received by a load from a preferred AC power source to an alternate AC power source, or transferring power being received by the load from the alternate AC power source to the preferred AC power source. The shared transfer switching system may comprise one first primary relay and one first secondary relay coupled in series, and in series with a preferred power source and a load, to enable the load to be powered by the preferred power source. The system may also include one second primary relay and one second secondary relay coupled in series, and also in series with an alternate power source and with the load, for providing power from the alternate power source to the load when the preferred power source is not available to power the load. The system may also include a controller for controlling operation of the second primary relay and the second secondary relay, and a switching subsystem. The switching subsystem may be in communication with the controller and the first primary relay, the first secondary relay, the second primary relay, the second secondary relay, and the load. The switching subsystem may be configured to be controlled by the controller to control a switch over from one or the other of the preferred or alternate power sources to the load. The system may also include a relay test subsystem including a relay test software module and a voltage detection subsystem operably associated with the controller for carrying out a relay test process. The relay test process includes performing a plurality of voltage tests by selectively opening and closing the second primary relay and the second secondary relay to verify proper operation of the second primary relay and the second secondary relay.

In another aspect, the present disclosure relates to a shared transfer switching system with built in relay testing ability, for transferring power received by a load from a preferred AC power source to an alternate AC power source, or transferring power being received by the load from the alternate AC power source to the preferred AC power source. The shared transfer switching system may comprise one first primary relay and one first secondary relay coupled in series, and in series with a preferred power source and a load, to enable the load to be powered by the preferred power source. The system may also include one second primary relay and one second secondary relay coupled in series, and also in series with an alternate power source and with the load, for providing power from the alternate power source to the load when the preferred power source is not available to power the load. The system may also include a controller for controlling operation of the second primary relay and the second secondary relay, and a switching subsystem. The switching subsystem may be in communication with the controller and the first primary relay, the first secondary relay, the second primary relay, the second secondary relay, and the load. The switching subsystem may be configured to be controlled by the controller to control a switch over from one or the other of the preferred or alternate power sources to the load. The system may also include a relay test subsystem including a relay test software module and a voltage detection subsystem operably associated with the controller for carrying out a relay test process. The relay test process includes performing a plurality of voltage tests by selectively opening and closing the second primary relay and the second secondary relay, to verify proper operation of the second primary relay and the second secondary relay.

In still another aspect, the present disclosure relates to a method for testing a plurality of relays associated with a system for transferring power from one or the other of a preferred AC power source or an alternate power source to a load. The method may comprise using one first primary relay and one first secondary relay coupled in series, and in series with a preferred power source and a load, to enable the load to be powered by the preferred power source. The method may further include using one second primary relay and one second secondary relay coupled in series, and also in series with an alternate power source and with the load, for providing power from the alternate power source to the load when the preferred power source is not available to power the load. The method may further include using a switching subsystem in communication with the first primary relay, the first secondary relay, the second primary relay, and the second secondary relay, and the load, the switching subsystem configured to be controlled to switch over from one or the other of the preferred or alternate power sources to the load. The method may further include carrying out a relay test process including performing a plurality of voltage tests by selectively opening and closing the second primary relay and the second secondary relay, to verify proper operation of the second primary relay and the second secondary relay.

Further areas of applicability will become apparent from the description provided herein. The description and specific examples in this summary are intended for purposes of illustration only and are not intended to limit the scope of the present disclosure.

DRAWINGS

The drawings described herein are for illustrative purposes only of selected embodiments and not all possible implementations, and are not intended to limit the scope of the present disclosure. In the drawings:

FIG. 11 shows another embodiment of the system of FIG. 1 which incorporates a relay test feature for testing the various relays of the system without the need to interrupt power from the preferred power source;

FIG. 12 shows the system of FIG. 11 but with a certain one of the relays closed (indicated by dashed lines) during one phase of the testing;

Corresponding reference numerals indicate corresponding parts throughout the several views of the drawings.

DETAILED DESCRIPTION

Example embodiments will now be described more fully with reference to the accompanying drawings.

The present disclosure, in the various embodiments discussed below, enables significantly faster transfer times that what is typically possible with present day electromechanical relays. In various embodiments, the switching performance of the relays is enhanced by use of a solid-state switching device, for example a TRIAC (bidirectional/bilateral triode thyristor), anti-parallel SCR (silicon-controlled rectifier) pairs, or an IGBT (insulated-gate bipolar transistor). The selected solid-state switching device is in connection with the relays' contacts and can close the circuit faster by two or three orders of magnitude than what is possible using just conventional electromechanical relays. Further, the solid-state switching device makes a configurable connection between either of the corresponding poles of the relay contacts of the circuits of the two power sources, such that the solid-state switching device is shared between the circuits of the two power sources. Thus the same solid-state switching circuit may be configured on the side of the active power source to provide soft-start during power up (cold start) or configured on the side of the inactive power source to facilitate a fast transfer. In the various embodiments discussed below, the solid-state device is kept activated until the relay contacts have settled into a closed state. During steady-state operation of the active source, the solid-state switch may be switched into connection with the relay contacts of the inactive source circuit to decrease the make time transfer. Importantly, the various embodiments all provide a soft-start feature which helps to limit the in-rush current through the components of the system when switching from one power source to another.

Figure 1:
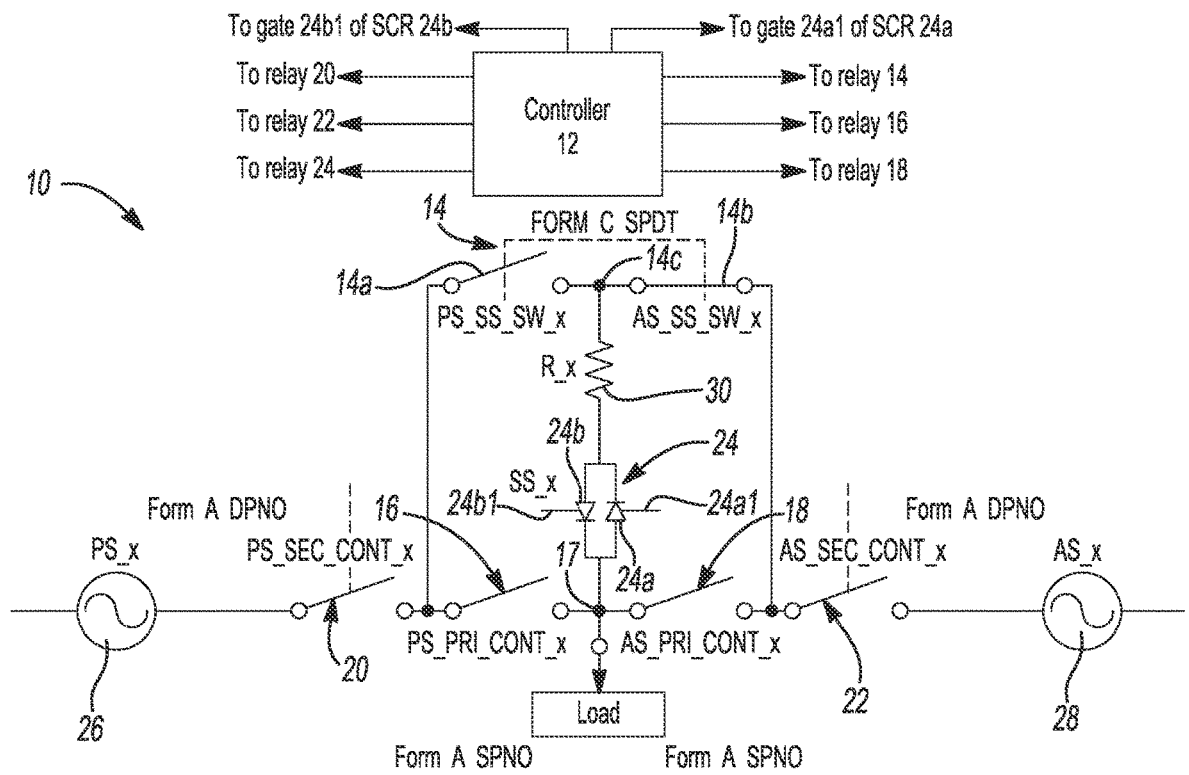
FIG. 1 is a diagram of one embodiment of a shared, hybrid transfer switch system coupled to a first (preferred) power source and a second (alternate) power source. The switching topology is symmetrical on both sides of the load, so only one side is illustrated to not clutter the drawing.

Referring to FIG. 1, a shared-hybrid switching system 10 is shown in accordance with one embodiment of the present disclosure. In this embodiment the system 10 includes a controller 12 for controlling the switching of a plurality of relays 14a and 14b, 16, 18, 20, 22, and an anti-parallel SCR pair 24, to control switching of power from one or the other of a "preferred" or primary AC power source 26 and an "alternate" or secondary AC power source 28, to a Load. It will be appreciated that the switching topology is symmetrical on both sides of the Load, so only one side has been illustrated in FIG. 1 so as to avoid cluttering the drawing.

Common sides of the relay contacts 14a and 14b are coupled to one another at a first common connection point 14c, and one side ("tail") of the anti-parallel SCR pair 24 is also coupled to the first connection point 14c. The purpose of the relays 14a and 14b is to "swing" the shared SCR circuit tail between power sources to enable fast transfer. The opposite side of the anti-parallel SCR pair 24 is coupled to a second common connection point 17 along with common sides of the primary relays 16 and 18. The Load is also in communication with the second connection point 17.

A thermistor 30, in this example a NTC thermistor, is coupled between one side of the SCR pair 24 and the first common connection point 14c, and forms a current limiter to mitigate contact current overload when the anti-parallel SCR pair 24 is turned on during a transition operation. The Load may be one or more devices or subsystems requiring AC power for operation, for example one or more servers, network switches, power distribution units (PDUs), or virtually any other component that requires AC power for its operation. The system 10 may be located within a suitable housing (not shown) and mounted in a data center equipment rack, and may incorporate one or more AC receptacles (not shown) for supplying AC power directly to other devices and components.

The relay 14a may be part of a first Form A double pole normally open (DPNO) relay assembly with another like relay (the like relay being part of the mirror image portion of the system 10 shown in FIG. 1). The relay 14b may similarly be part of a second Form A DPNO relay assembly used in the mirror image portion of the system 10. Optionally, relays 14a and 14b may comprise a Form C single pole double throw (SPDT) bistable relay. While it is believed that configuring the relays 14a and 14b as portions of separate Form A DPNO relays will be the more preferred implementation, both implementations are possible.

The primary relays 16 and 18 may be Form A single pole normally open (SPNO) relay contacts (the conventional snubber circuit is not shown). The secondary relays 20 and 22 may comprise Form A DPNO relay contacts to provide source isolation for predictable startup state and operation in a diagnostics mode (the conventional snubber circuit is not shown). By diagnostics mode, it is meant that relay 20 or relay 22 can be opened when the circuit is closed on the opposite side, so that the primary relays 16 or 18 may be momentarily closed in sequence, without causing cross-conduction between the sources. By sensing the voltage change across the contacts of primary relays 16 or 18, the controller 12 may determine if relay 16 or relay 18 may be closed or opened. For each secondary relay 20 and 22, its contacts are connected in parallel with a voltage sensing resistor string (not shown in FIG. 1), such that each voltage sensing resistor string bridges the secondary relay contacts, and when the secondary relays are closed, the voltage sensing resistor string is partially shunted. The anti-parallel SCR pair 24 includes SCRs 24a and 24b, with the gates 24a1 and 24b1 of the two SCRs being in communication with the controller 12. The anti-parallel SCR pair 24 likewise preferably includes a snubber circuit and a series fail safe fuse, which are not shown to avoid cluttering the drawing.

Figure 2:
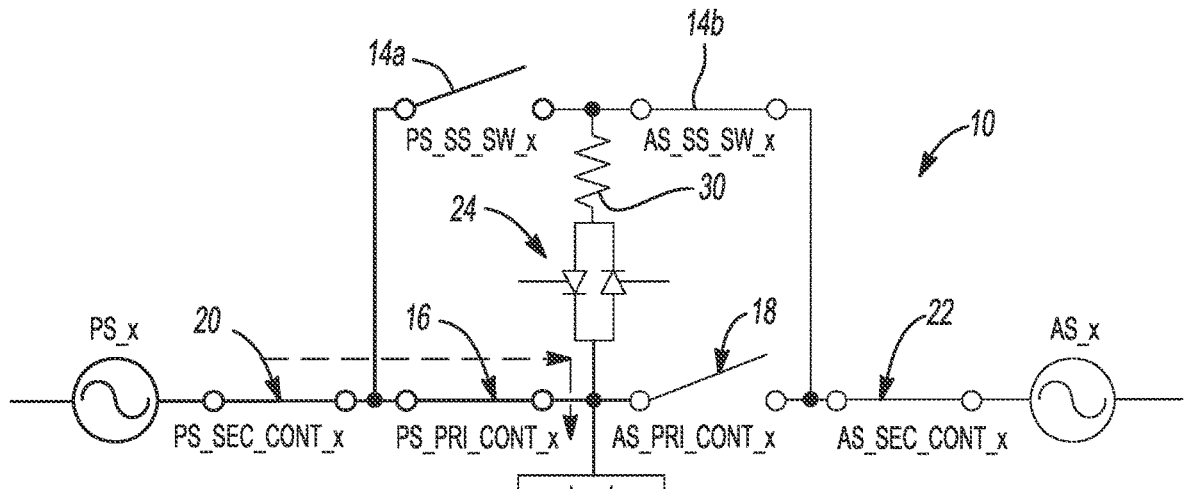
FIG. 2 shows the system of FIG. 1 with the various relay contacts in the positions they assume when the system is in a steady state of operation receiving power from a first power source.

Referring to FIGS. 2-5, the operation of the system 10 will be described. FIG. 2 shows the system 10 in a steady state of operation being supplied with power from the preferred power source 26. Relay contact 14a is open, relay contact 14b is closed, the SCRs of the anti-parallel SCR pair 24 are both turned off, relay 16 is closed and relay 18 is open.

Current flows according to the dashed arrow from preferred power source 26, through relay contacts 20 and 16, to the Load.

Figure 3:
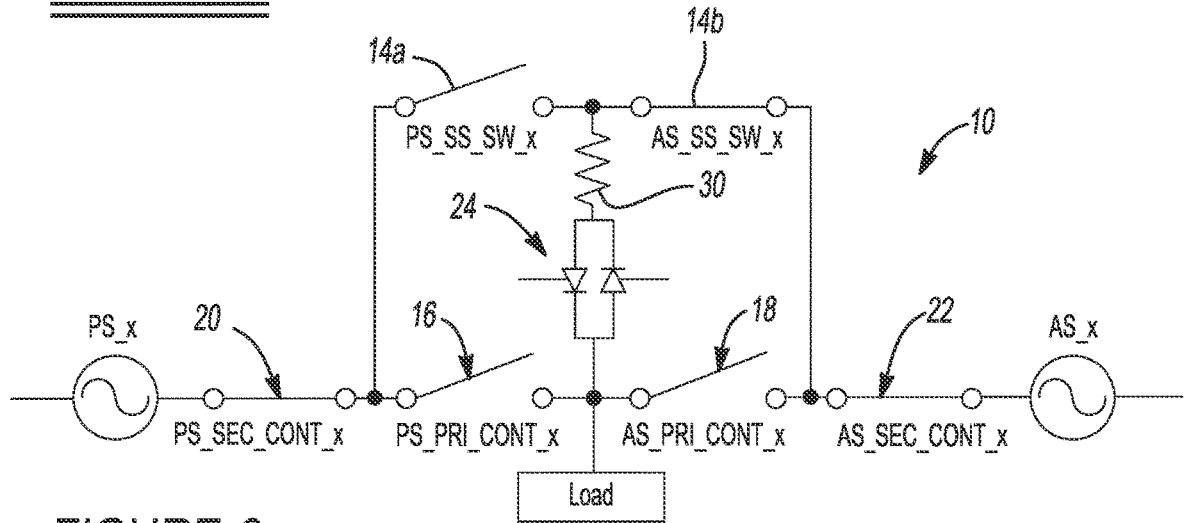
FIG. 3 shows how specific relays are controlled during a first intermediate step of a switching sequence in switching the load from the first power source to the second power source for an open transition, in which one of the relay contacts associated with the preferred power source is initially opened, to momentarily interrupt power to the Load.

FIG. 3 shows the first operation in switching to power from the alternate power source 28. The system 10, again, in this example is configured as a "break before make" system, although it is possible to control the system 10 such that it operates as a "make before break" switching system. It is expected, however, that the "break before make" control scheme will be the more preferred control configuration.

With the "break before make" switching control methodology, the relay 16 is initially opened. Relay contacts 14a and 14b, relay contact 18 and relay contact 22 remain in the same position as shown in FIG. 2.

Figure 4:
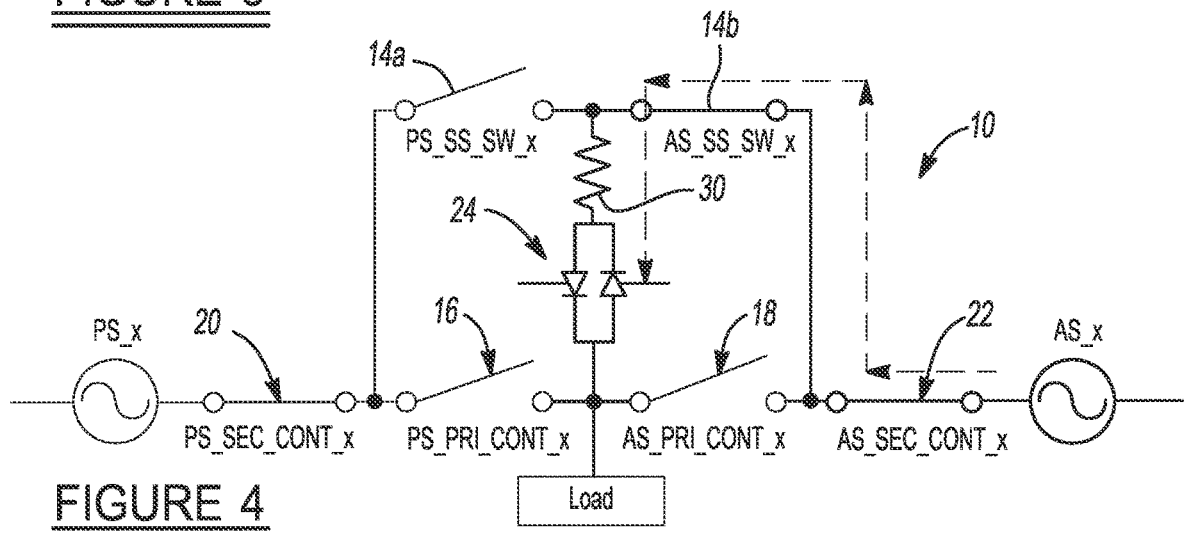
FIG. 4 shows how specific relays of the system are further controlled during a second intermediate step in which the anti-parallel SCR circuit is turned on to provide an alternate current path from the alternate power source to the Load.

FIG. 4 shows the next operation in which either the SCR 24a or the SCR 24b of the SCR pair 24 is then triggered on by the controller 12. It should be understood that the two SCRs in the SCR pair 24 do not both conduct simultaneously when triggered on by the controller 12. One of the SCRs conducts during the positive quadrant of the sinusoid, and the other conducts during the negative quadrant of the sinusoid. Thus the SCRs 24a and 24b conduct alternately as the sinusoid alternates positive and negative. All of the relay contacts 14a, 14b, 16, 18, 20 and 22 remain in the same state as shown in FIG. 3. With either the SCR 24a or the SCR 24b triggered on, current now flows from the alternate power source 28 through relay contact 14b, and through the SCR 24a or SCR 24b to the Load. For convenience, the alternating operation of the SCRs 24a and 24b will hereinafter be described as the operation of the "anti-parallel SCR pair 24".

Figure 5:
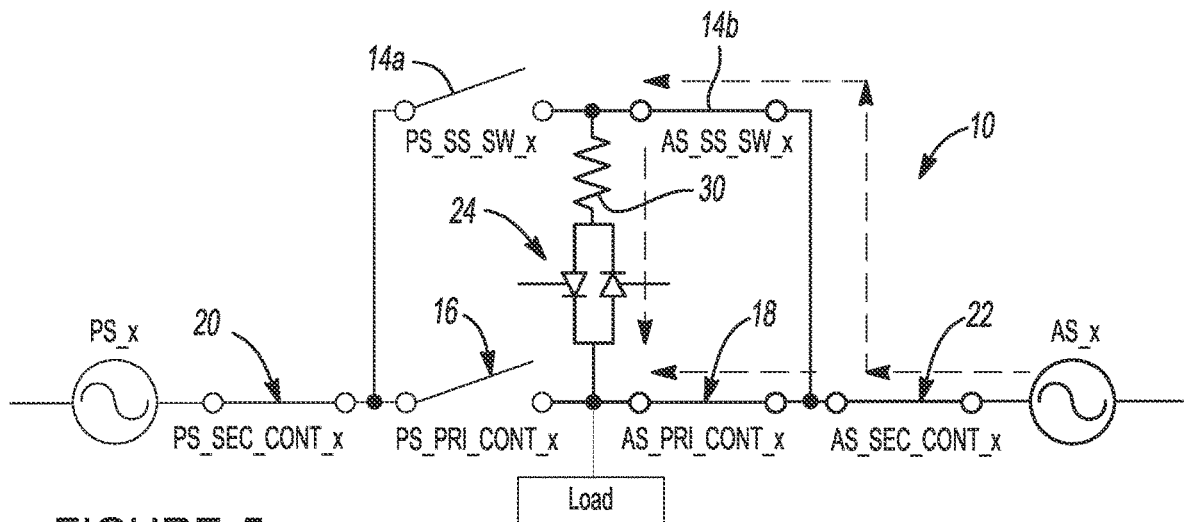
FIG. 5 shows how specific relays of the system are further controlled during a further intermediate step, in which one of the relay contacts associated with the alternate power source is closed, with the anti-parallel SCR circuit forming an alternate current path to the Load.

FIG. 5 shows the next operation in which, while the anti-parallel SCR pair 24 is maintained in an "on" state by the controller 12, the controller closes relay contact 18. This places the anti-parallel SCR pair 24 in parallel with relay contact 18. Current is thus able to flow to the Load through relay contacts 18 and 22, as well as through the combination of the relay contact 14b and the anti-parallel SCR pair 24. It will be appreciated that the anti-parallel SCR pair 24 has essentially enabled power to be provided until the relay contact 18 is closed in FIG. 5, thus overcoming the delay time that would have otherwise been experienced in waiting for the relay contact 18 to respond and fully close.

Figure 6:
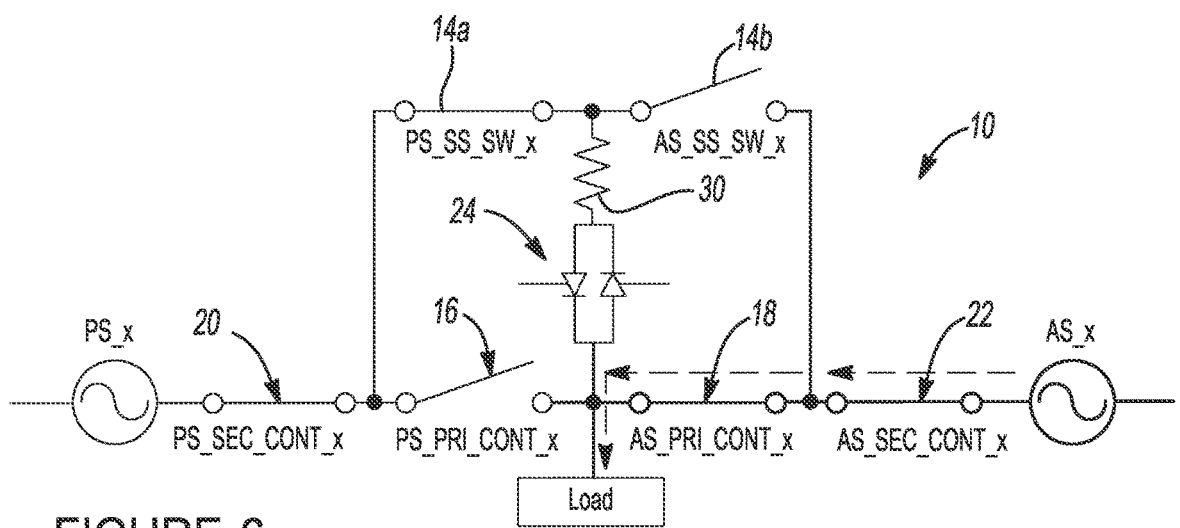
FIG. 6 shows the positions of the contacts of the various relays of the system when the system is operating in a steady state after having transitioned to using a second power source, and after having turned off the anti-parallel SCR circuit.

FIG. 6 shows the next operation in which the anti-parallel SCR pair 24 is no longer triggered by the controller 12 and naturally commutates off, relay contact 14b is opened and relay contact 14a is closed. This final configuration of the relays 14a and 14b shown in FIG. 6 prepares the system 10 for the next transition in the event the preferred power source 26 is re-selected as the power source for the system 10.

Figure 7:
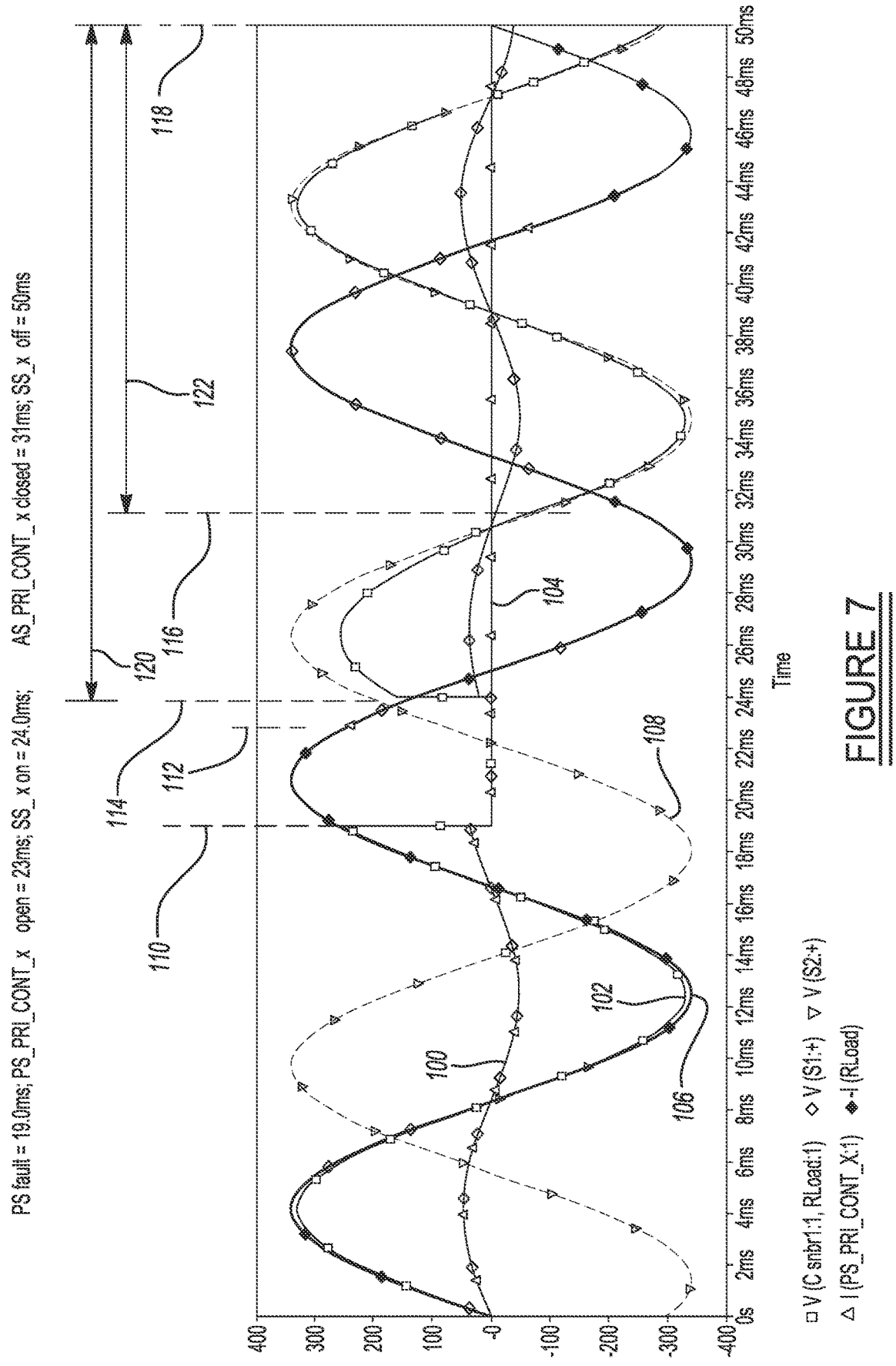
FIG. 7 is a graph showing the timing of the transitions that occur when switching from the preferred power source to the alternate power source.

FIG. 7 shows a plurality of graphs to illustrate the timing of the above described transition from the preferred power source 26 to the alternate power source 28. It should be understood that the FIG. 7 depicts idealized (simulated) waveforms; in an actual circuit, when contacts are commanded to open, they cannot break instantaneously, as shown here. Curve 100 represents the current through relay contacts 20 and 16 and the Load when the preferred power source is active; curve 102 represents the voltage across the Load; line 104 represents the current through the relay contacts 22 and 18 and the Load when the alternate power source is active; curve 106 represents the preferred power source voltage before relay contact 20; and curve 108 represents the alternate power source voltage before relay contact 22. At point 110 a fault occurs, which is at the 19.0 ms point on the graph. Current to the Load drops to zero and the controller 12 commands relay contact 16 to open. At point 112, which is 23 ms on the graph timeline (i.e., 4 ms after the fault occurs), the relay contact 16 finally opens after its inherent delay. At point 114, which is 24 ms on the graph timeline (i.e., 5 ms after the fault has occurred), the anti-parallel SCR pair 24 is triggered on and relay contact 18 is commanded to be closed by the controller 12. This action occurs only 5 ms after the fault is detected. At point 116, which is 31 ms on the graph timeline, the relay contact 18 finally opens after its inherent delay. At point 118, which is the 50 ms point on the graph, the anti-parallel SCR pair 24 is no longer triggered by the controller and naturally commutates off. Arrow 120 represents the total time duration during which one of the SCRs of the anti-parallel SCR pair 24 is conducting and supplying current to the Load, while arrow 122 indicates the total overlap time during which one of the SCRs of the anti-parallel SCR pair 24 is connected in parallel with the relay contact 18. In this example the total time that the Load experiences no power being supplied is only 5 ms, which is well within the desired timeframe of 8 ms or less at a 60 Hz line frequency as specified by the ITIC curve developed by the Information Technology Industry Council.

Figure 8:
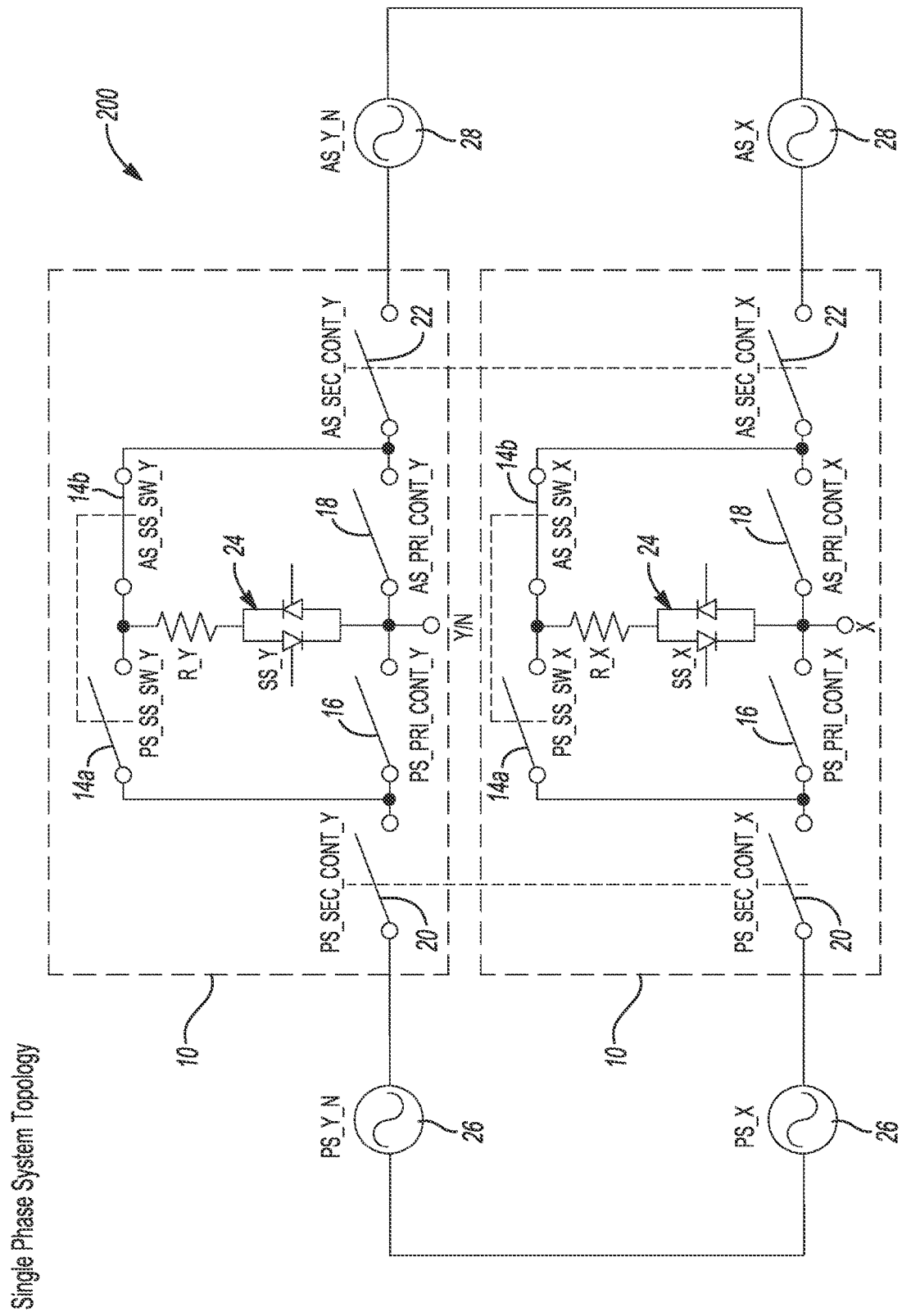
FIG. 8 shows an embodiment of the system configured to handle a single phase AC power source.

FIG. 8 shows a system 200 in accordance with the present disclosure configured to implement a single phase topology. In this embodiment essentially two iterations of the system 10 are incorporated, with each pair of relays 14a, 14b, 20 and 22 being respectively controlled together.

Figure 9:
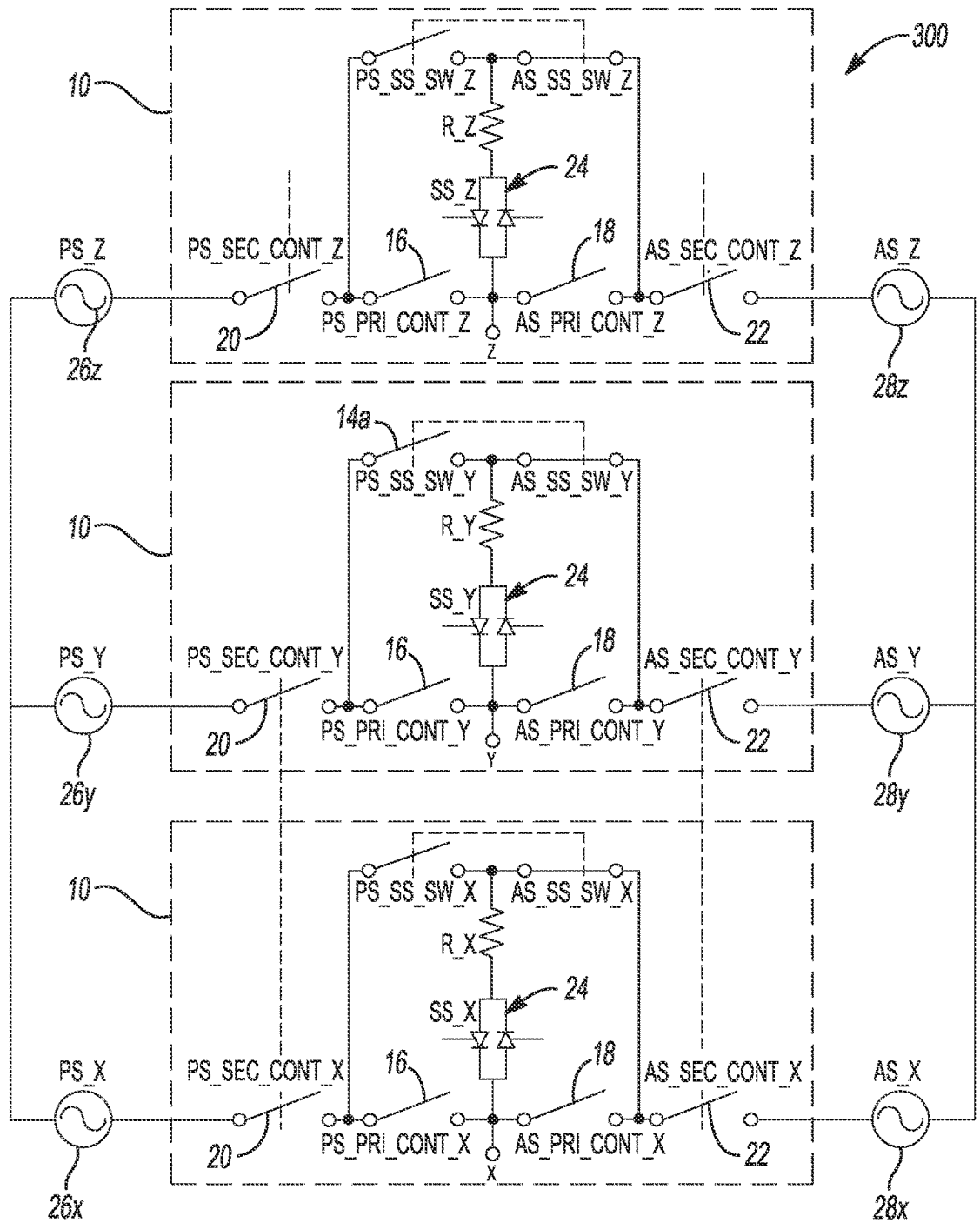
FIG. 9 shows an embodiment of the system configured to handle a 3-phase delta AC power source.

FIG. 9 shows a system 300 in accordance with the present disclosure configured to implement a 3-phase delta topology. One instance of the system 10 is used for controlling transitions from each of the X, Y and Z phases 26x/26y/26z of a preferred power source to the X, Y and Z phases 28x/28y/28z of an alternate power source.

Figure 10:
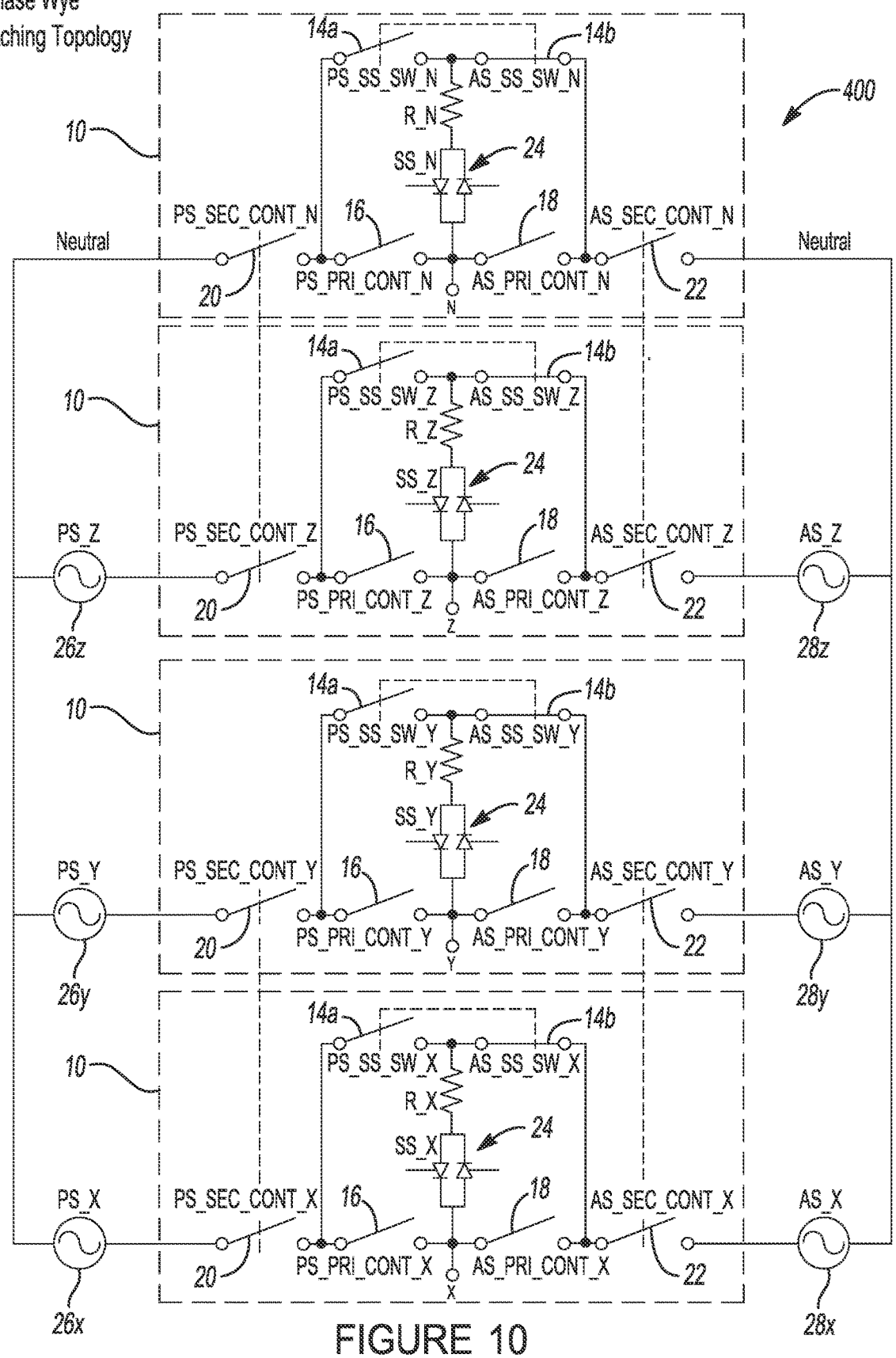
FIG. 10 shows an embodiment of the system configured to handle a 3-phase wye configured AC power source.

FIG. 10 shows a system 400 in accordance with the present disclosure configured to implement a 3-phase wye topology. In this implementation four instances of the system 10 are used to control transitions from each one of the preferred power phases X, Y and Z (labelled 26x, 26y, 26z), and the Neutral, and the alternate power source phases X, Y and Z (labelled 28x, 28y and 28z), and the Neutral line. In this implementation the relay contacts 20 of the two instances of the system 10 associated with the X and Y phases are switched together, and the relay contacts 20 of the two instances of the system 10 associated with the Y phase and the Neutral line are switched together. The relay contacts 14a, 14b and 22 are handled in the same fashion.

The various embodiments of the system 10 presented herein may also be implemented in a "make before break" ("closed transition") configuration. The source voltages phasing may be unsynchronized or synchronized, with the latter condition required for the "closed transition" configuration.

Although the various embodiments described herein illustrate an anti-parallel SCR pair 24 as the solid-state switching component, it will be appreciated that other solid-state components, for example and without limitation, insulated gate bipolar transistors (IGBTs) or TRIACs may be used as the solid-state switching devices with little modification required to the system 10.

Another advantage of the present system 10 is that since the anti-parallel SCR pair 24 is only required to carry current for a brief time interval until the relay contacts 16 and 18 have settled during a transition operation, the SCRs of the anti-parallel SCR pair 24 may have a lower duty rating that what would otherwise be needed to handle the current flow from the preferred power source 26 or the alternate power source 28.

The system 10 also provides a significant "soft start" benefit in that, at start up, the anti-parallel SCR pair 24 are gradually triggered at larger conduction angles until turned on fully. This ramps up the voltage so that the current flow into the Load is effectively ramped up, too. This soft start benefit also mitigates inrush current during a cold start, when power is initially applied to a reactive load in a fully discharged state.

The use of the solid-state anti-parallel SCR pair 24 in parallel with the contacts facilitates fast transfer, of course, but also the shunting action of the SCRs means that the relay contacts can naturally bounce into a final closed position without causing arcing, wear and erosion of the contact surface of each of the relays, which often occurs with conventional power transfer circuits when abruptly switching from one power source to another. The significant reduction and/or elimination of contact bounce can extend the life of the relay contacts, as well as reduce the stress on other various components of the system 10 caused by large inrush currents.

Referring to FIGS. 11 and 12, a system 500 in accordance with another embodiment of the present disclosure is shown which incorporates relay test software module ("RTSM") 12*b* accessible by the controller 12 and a relay voltage detection subsystem 12*c*. The voltage detection subsystem 12*c* makes use of a voltage sensing resistor string ("VSRS") subsystem 12*d*, which is a conventional voltage sensing circuit comprised of both series and parallel coupled resistors, and is coupled at a node (node N1) and also to ground. The construction of the VSRS subsystem 12*d* is well known in the art, and this subsystem may form a portion of the voltage detection subsystem 12*c* or it may form a stand-alone circuit. And while the VSRS 12*d* is shown coupled only across the secondary relay 22 in FIG. 11, it will be appreciated that an additional VSRS identical to the VSRS 12*d* will also be coupled across the secondary relay 20 for monitoring the voltage at node N2, and also in communication with the controller 12, but such has been omitted to avoid cluttering the figure. Optionally, a suitable switching subsystem may be used to controllably uncouple the VSRS subsystem 12*d* from node N1 and place it at node N2, across the secondary relay 20 with respect to ground.

Optionally, but preferably, a load voltage sensing resistor string ("LVSRS") subsystem 12*e* is also incorporated in the system 500. The LVSRS subsystem 12*e* is comprised of series and parallel coupled resistors, and is coupled across the Load and ground, and enables monitoring a voltage across a load in real time, or at selected times commanded by the controller 12. Collectively, the RTSM 12*b*, the voltage detection subsystem 12*c*, and the VSRS subsystem 12*d* may be viewed as forming a "relay test subsystem." If the LVSRS subsystem 12*e* is included, this component may also form a portion of the voltage detection subsystem 12*c*. Also, while the RTSM 12*b* is shown stored in a non-volatile memory 12*a* associated with the controller 12, it will be appreciated that the RTSM 12*b* could instead be stored in a stand-alone non-volatile memory component that is accessible by the controller 12.

The system 500 also includes a user interface 13 having a Human Machine Interface ("HMI") health button 13*a*. The HMI health button 13*a* enables a user to initiate a relay test operation using the RTSM 12*b*, which will be described in detail in the following paragraphs. The HMI health button 13*a*, or optionally a separate dedicated control, may enable a user to also initiate a check of the voltage across the Load using the LVSRS subsystem 12*e*, which will be described in greater detail in the following paragraphs. In one preferred implementation the voltage detection subsystem 12*c* may capture sample waveforms using both the VSRS subsystem 12*d* and the LVSRS subsystem 12*e* simultaneously.

The RTSM 12*b* functionality of the system 500 provides a plurality of important benefits, without requiring the addition of extra electrical components (e.g., additional relays, dummy loads, etc.) into the system 500 to check the functioning of the relays 18/22 and 16/20. Accordingly, the physical components and interconnections of the system 500 may be identical to those of system 10, with the exception of the non-volatile memory 12*a*, the RTSM 12*b*, the VSRS 12*d* and the user interface 13.

The RTSM 12*b* enables the relays 18 and 22 to be tested while the Load is being powered by the preferred power source 26. Conversely, the RTSM 12*b* allows the relays 16 and 20 to each be tested while the Load is being powered by the alternate power source 28. The sequence of operations carried out by the controller 12 using the RTSM 12*b* is the same in both cases, so the following description will describe only the operations of testing relays 18 and 22, with it being understood that identical operations are carried out in testing relays 16 and 20 when the alternate power source 28 is being used and the preferred power source is not being used. It will also be understood that the system 500 shown in FIGS. 11 and 12, like system 10 in FIG. 1, illustrates only one-half of the components required to carry out system operation, with it being appreciated that the switching topology is symmetrical on both sides of the Load, and controlled in the same way using the RTSM 12*b*, so only one side has been illustrated in FIGS. 11 and 12 so as to avoid cluttering the drawing.

Figure 13:
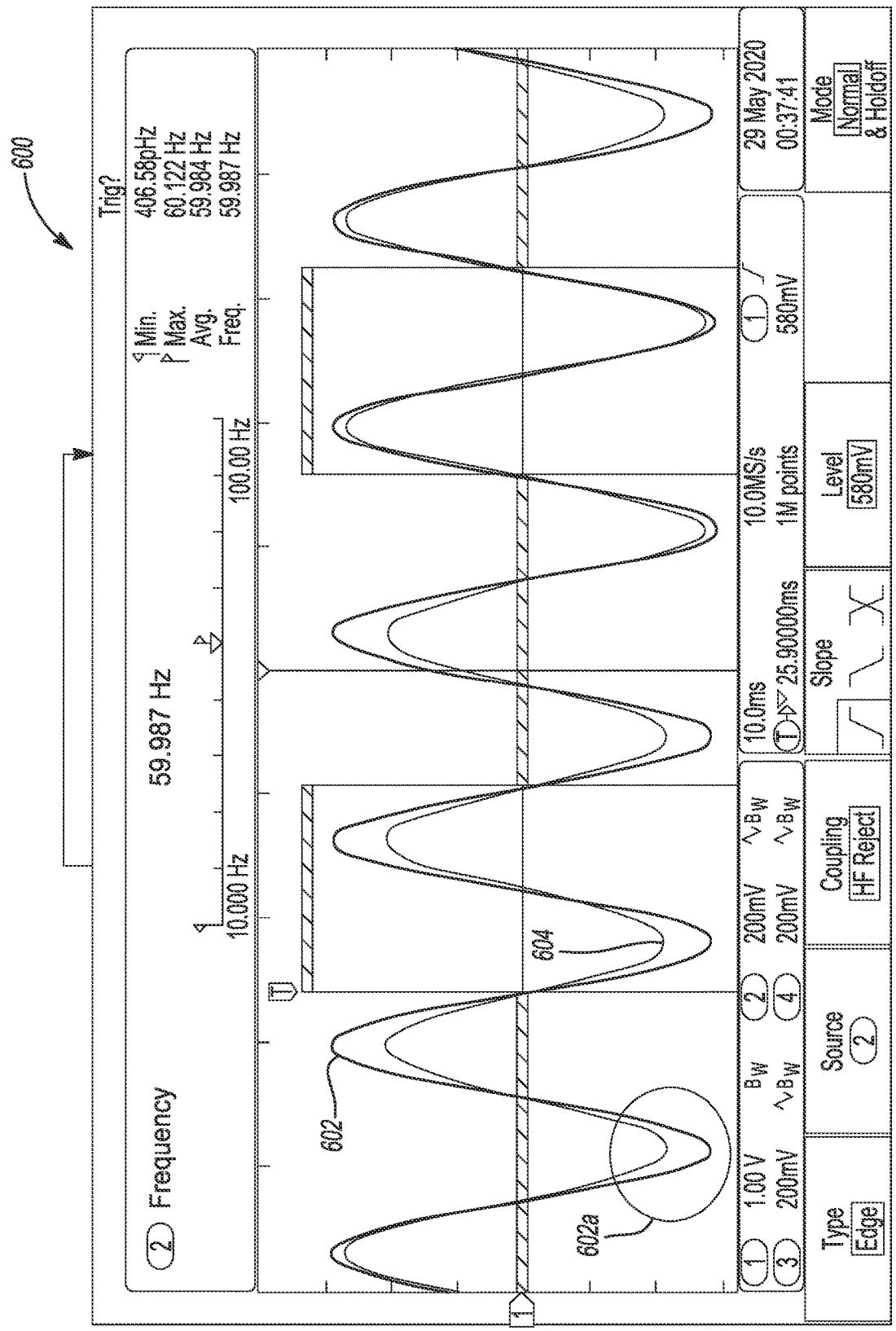
FIG. 13 is an illustration of various waveforms which help to illustrate the detected voltages at various stages of the relay tests performed under the control of the controller.

In FIG. 11, it will be appreciated that while the preferred power source 26 is powering the Load, both of the secondary relays 20 and 22 are closed, primary relay 16 is closed, primary relay 18 is open, relay 14*b* is closed and the SCR 24 is turned off. When the contacts of the secondary relay 22 are closed and the resistors of the VSRS 12*d* are partially shunted (shorted) by the action of the relay contacts, the voltage between the primary relay 18 and the secondary relay 22, which are series connected, will match the input voltage at the alternate (inactive) power source 28. Thus, with the primary relay 18 in FIG. 11 open and the secondary relay 22 closed, the voltage at node N1 detected by the voltage detection subsystem 12*c*, using the VSRS 12*d*, will be the input voltage provided by the alternate power source 28. With brief reference to FIG. 13, the voltage at the input of the alternate power source 28 is identified by the waveform 602, and the voltage between the primary relay 18 and the secondary relay 22 (at node N1) is identified by waveform 604.

While the system is operating in its normal auto-transfer detection state, with preferred power source 26 powering the Load, the user may press the HMI health button 13*a*. This action will open both the alternate source secondary relay 22 and relay 14*b*, as shown in FIG. 12, assuming that relays 22 and 14*b* are operating properly. When the contacts of secondary relay 22 break (i.e., the relay opens), the number of resistors that are "active" in the VSRS 12*d* increases, such that the change in voltage drop across the VSRS 12*d* effectively causes a decrease in the measured voltage level at node N1 relative to the input voltage at the alternate power source 28. The voltage measured at node N1 drops substantially (typically by 15% or slightly more), as indicated by the difference between waveforms 602 and 604 at point 602*a* in FIG. 13. Thus, the voltage measured by the voltage detection subsystem 12*c* at node N1, using the VSRS 12*d*, will drop appreciably when the secondary relay 22 is commanded by the RTSM 12*b* to open and its contacts actually open.

If the peak voltage detected at node N1 is equal to or less than 85% of nominal peak reference voltage, then it may be determined that the secondary relay 22 has successfully opened. The nominal peak reference voltage is established during the steady state operation as the nominal AC output of the preferred power source 26, prior to a condition that elicits an auto transfer operation. Under normal operating conditions, the input voltage available from the alternate power source 28 will be nearly equivalent to nominal peak reference voltage.

Next, during a second phase of operation, the RTSM 12*b* causes primary relay 18 associated with the alternate power source 28 to be closed, as indicated by line 18' in FIG. 12. This connects the preferred power source 26 to the primary relay 18. More specifically, the preferred power source 26 is connected to node N1. The peak voltage is again measured at the inactive source's primary and secondary relay series connection (i.e., at node N1). If the peak voltage is restored to within a few percent margin of the nominal voltage (i.e., the primary power source 26 voltage), then it can be determined that the primary relay 18 has successfully closed.

The final operations are for the controller 12 to restore the normal relay states, that is, to command the inactive source's primary relay 18 to open, and to command relay 14*b* and the secondary relay 22 to close. After these operations, the system 500 returns to normal auto-detection operation.

Figure 14:
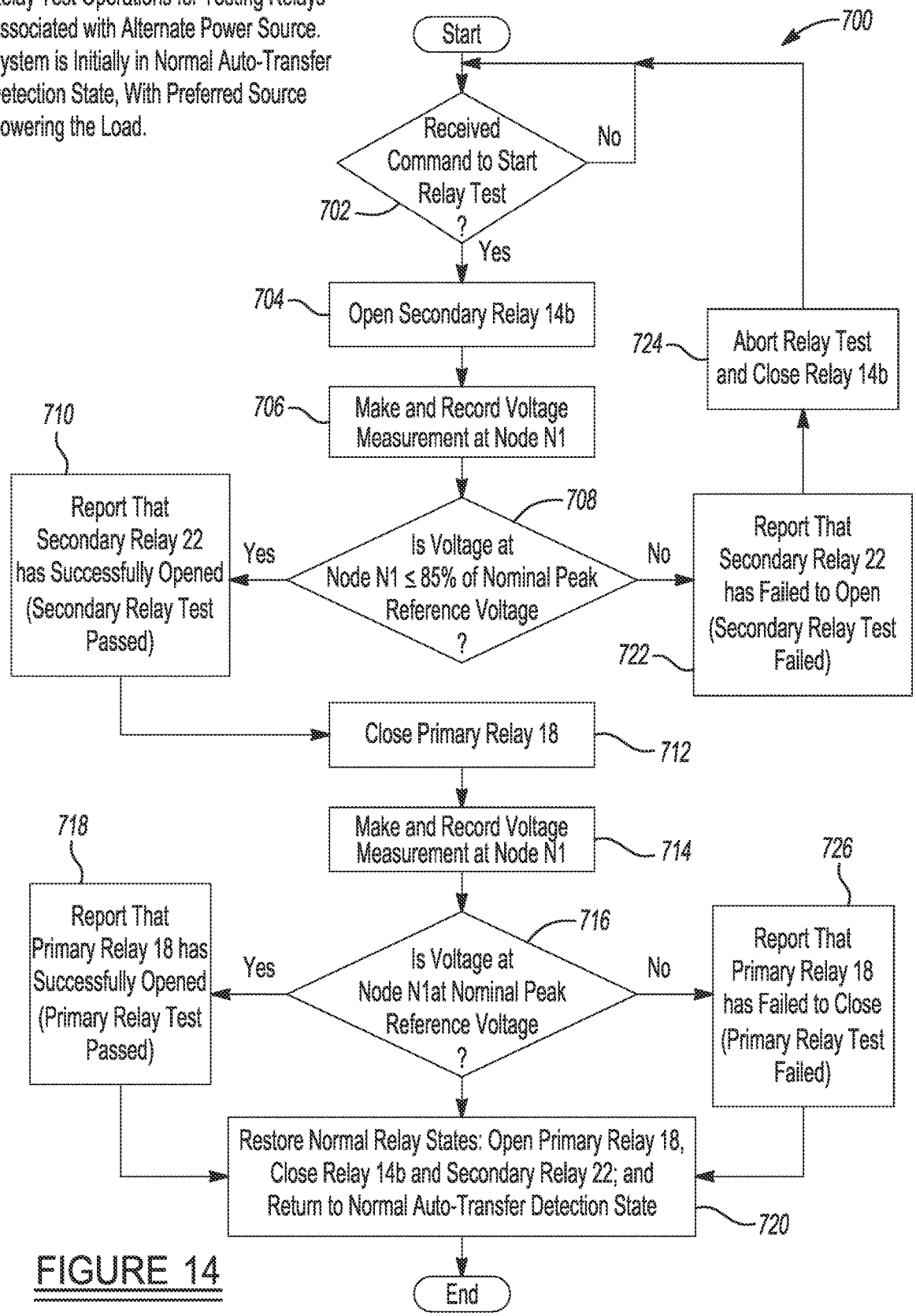
FIG. 14 shows a flowchart of various operations that may be performed by the system of FIG. 11 in checking the various relays associated with the alternate power source.

Referring briefly to a flowchart 700 of FIG. 14, the above-described operations for checking the primary relay 18 and the secondary relay 22, while the system 500 is using the preferred power source 26 to power the Load, are summarized. The operations in flowchart 700 of FIG. 14 are carried out when the system is initially in its normal auto-transfer detection state (i.e., as shown in FIG. 11). It will be appreciated that the corresponding operations shown in FIG. 14 may be used when checking the relays 16 and 20 while the system is using the alternate power source 28 for providing power to the Load.

At operation 702 the controller 12 makes a determination if a command has been received from a user to start the relay test process (i.e., typically from the HMI health button 13*a*). If such a command is received, then at operation 704 the controller 12 begins using the RTSM 12*b* to open relay 14*b* and secondary relay 22. The voltage detection subsystem 12*c* and the VSRS 12*d* are then used to make a voltage measurement at node N1, as indicated at operation 706. This voltage reading may be recorded in the memory 12*a*. The RTSM 12*b* then causes the controller 12 to make a check if the voltage present at node N1 is equal to or less than 85% of the nominal peak reference voltage, as indicated at operation 708. If the check at operation 708 produces a "NO" answer, this indicates that the secondary relay 22 has failed to open, and at operation 722 the RTSM 12*b* causes the controller 12 to report that the secondary relay test has failed, and at operation 724 the RTSM 12*b* causes the controller 12 to abort the relay test procedure and close relay 14*b* to restore the normal auto-transfer detection state. If the test at operation 708 produces a "YES" answer, the secondary relay 22 has successfully opened, and at operation 710, RTSM 12*b* causes the controller 12 to report that the secondary relay test has been passed. The RTSM 12*b* then causes the controller 12 to close the primary relay 18, as indicated at operation 712. The RTSM 12*b* then causes the controller 12 to make another voltage check at node N1, as indicated at operation 714. The RTSM 12*b* then causes the controller 12*b* to determine if the voltage just measured at node N1 is at, or close to, the nominal peak reference voltage, as indicated at operation 716. If this test produces a "YES" answer, then the controller 12 may report/record that the primary relay 18 has successfully closed, and the primary relay test has been passed, as indicated at operation 718. If the check at operation 716 produces a "NO" answer, then at operation 726 the RTSM 12*b* causes the controller 12 to report that the primary relay has failed to close, and the primary relay test has not been passed. After relay testing is complete and test results have been reported, at operation 720 the RTSM 12*b* causes the controller 12 to restore the relay states for normal auto-transfer detection and end the relay test process.

It will be appreciated that the specific order of operations shown in the flowchart 700 of FIG. 14 may be varied, and thus the system 500 is not necessarily limited to the exact sequence of operations shown in FIG. 14.

A significant advantage of the system 500 and the RTSM 12*b* is that the voltage tests described above can be completed in just a few line cycles of the AC signal, for example, in only six line cycles of the AC input signal from the primary power source 26. Still another significant benefit is that the relay voltage tests described above can all be carried out without interrupting the supply of power to the Load from the preferred power source 26. Likewise, if the system 500 is operating using power from the alternate power source 28, then the relays associated with the preferred power source (i.e., relays 16 and 20) can all be checked without interrupting power from the alternate power source 28 to the Load. As such, the controller 12 may be programmed, for example, to perform the above-described voltage tests through the controlled opening/closing of the various relays on a scheduled basis, such as weekly, without needing to switch the Load to a different power source before performing the relay tests.

If the LVSRS subsystem 12*e* is incorporated, the system 500 can be commanded to make a voltage check of the voltage across the Load. As noted above, this check can be made simultaneously with a check being performed by the VSRS subsystem 12*d*. The LVSRS subsystem 12*e* sensing capability provides redundancy and can help determine whether an internal or external fault has occurred during normal run time that caused a transfer; for example, the active power source's primary relay (relay 16 or relay 18) unexpectedly opened. For example, if the active source is the preferred AC power source 26, and the primary relay 16 was to unexpectedly open, this would mean that the output voltage reading would be invalid, but the input voltage from the preferred AC power source 26 would still be present. Otherwise, if during testing the LVSRS subsystem 12*e* detects a loss of voltage or an unqualified voltage, then the system 500 will automatically transfer to the other power source (i.e., preferred power source 26 or alternate power source 28). A loss of voltage may have occurred due to source failure or an internal hardware fault, e.g., a secondary or primary relay contact spontaneously opened. If the internal hardware fault is a permanent condition, then the self-test would reveal the internal failure as the root cause.

The LVSRS subsystem 12*e* thus provides a valuable subsystem for helping to assess the health of the primary relays 16 and 18. Importantly, the testing performed using both the LVSRS subsystem 12*e* and the VSRS subsystem 12*d* may be performed without interrupting power to the Load.

Perhaps the most significant benefit of the system 500, is its ability to perform the above-described, comprehensive relay test operations on all of the relays associated with both the preferred and alternate power sources, without the need to add in any additional hardware components (e.g., one or more additional relays, switches, dummy loads, etc.) into the system 500, or otherwise require any modifications to the overall hardware design of the system. The relay tests described above can be completed in just milliseconds, which virtually eliminates any concern if a switchover to the alternate power source 28 is needed to address an emergency situation where power is suddenly lost from the preferred power source 26 (or vice versa).

It will also be understood that while the system 500 has been described as being implemented in connection with the hardware configuration shown in FIG. 1, the RTSM 12*b* could be incorporated for use with any of the other embodiments described herein.

The foregoing description of the embodiments has been provided for purposes of illustration and description. It is not intended to be exhaustive or to limit the disclosure. Individual elements or features of a particular embodiment are generally not limited to that particular embodiment, but, where applicable, are interchangeable and can be used in a selected embodiment, even if not specifically shown or described. The same may also be varied in many ways. Such variations are not to be regarded as a departure from the disclosure, and all such modifications are intended to be included within the scope of the disclosure.

Example embodiments are provided so that this disclosure will be thorough, and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms and that neither should be construed to limit the scope of the disclosure. In some example embodiments, well-known processes, well-known device structures, and well-known technologies are not described in detail.

The terminology used herein is for the purpose of describing particular example embodiments only and is not intended to be limiting. As used herein, the singular forms "a," "an," and "the" may be intended to include the plural forms as well, unless the context clearly indicates otherwise. The terms "comprises," "comprising," "including," and "having," are inclusive and therefore specify the presence of stated features, integers, steps, operations, elements, and/or components, but do not preclude the presence or addition of one or more other features, integers, steps, operations, elements, components, and/or groups thereof. The method steps, processes, and operations described herein are not to be construed as necessarily requiring their performance in the particular order discussed or illustrated, unless specifically identified as an order of performance. It is also to be understood that additional or alternative steps may be employed.

When an element or layer is referred to as being "on," "engaged to," "connected to," or "coupled to" another element or layer, it may be directly on, engaged, connected or coupled to the other element or layer, or intervening elements or layers may be present. In contrast, when an element is referred to as being "directly on," "directly engaged to," "directly connected to," or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer or section. Terms such as "first," "second," and other numerical terms when used herein do not imply a sequence or order unless clearly indicated by the context. Thus, a first element, component, region, layer or section discussed below could be termed a second element, component, region, layer or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

What is claimed is:

1. A shared transfer switching system with built in relay testing ability, for transferring power received by a load from a preferred AC power source to an alternate AC power source, or transferring power being received by the load from the alternate AC power source to the preferred AC power source, the shared transfer switching system comprising:

one first primary relay and one first secondary relay coupled in series, and in series with the preferred power source and the load, to enable the load to be powered by the preferred power source;

one second primary relay and one second secondary relay coupled in series, and also in series with the alternate power source and with the load, for providing power from the alternate power source to the load when the preferred power source is not available to power the load;

a voltage sensing resistor string (VSRS) coupled across the second secondary relay;

a controller for controlling operation of the second primary relay and the second secondary relay;

a switching subsystem in communication with the controller and the first primary relay, the first secondary relay, the second primary relay, and the second secondary relay, and the load, the switching subsystem configured to be controlled by the controller to control a switch over from one or the other of the preferred or alternate power sources to the load; and a relay test subsystem including a relay test software module and a voltage detection subsystem operably controlled by the controller for carrying out a relay test process including performing a plurality of voltage tests by;

while the first primary relay and the first secondary relay are closed, and while the second primary relay is open, opening the second secondary relay, and using power from the alternate power supply to help verify, through a first voltage measurement taken using the VSRS, that the second secondary relay has opened, without causing an interruption of power to the load;

opening the second secondary relay without interrupting power to the load;

closing the second primary relay while the second secondary relay remains open, and while the first primary relay and the first secondary relay both remain closed, and using the VSRS to obtain a second voltage measurement, while using the power from the preferred power source and without interrupting power to the load, to verify that the second primary relay has successfully closed.

2. The system of claim 1, wherein the voltage sensing resistor string of the voltage detection subsystem is configured to help make a voltage measurement at a node which is between the second primary relay and the second secondary relay, and in series with the second primary relay and the second secondary relay.

3. The system of claim 2, further comprising a user interface having a control for enabling the relay test process.

4. The system of claim 1, wherein the relay test software module carries out the relay test process by opening the second secondary relay while the second primary relay is open and making a voltage test at a node representing an intermediate point therebetween, and then closing the second primary relay while the second secondary relay is open and making a voltage test at the node.

5. The system of claim 4, wherein the relay test module is configured to carry out the relay test process by opening the first secondary relay while the first primary relay is open, and making a voltage test at the node, and then closing the first primary relay while the first secondary relay is open and making a voltage test at the node.

6. The system of claim 1, further comprising a load voltage sensing resistor string in communication with the controller, for monitoring a voltage across the load to help in evaluating a condition of one or more of the first primary relay or the second primary relay.

7. The system of claim 1, wherein the switching subsystem includes an additional relay and a solid-state switching device, configured to work in series to provide a temporary current path between the alternate power source and the Load, when the additional relay is in a closed condition and the solid-state switching device is turned on, during a switchover operation when a switchover is made from the preferred power source to the alternate power source; and wherein the additional relay is opened when initiating the relay test process.

8. A shared transfer switching system with built in relay testing ability, for transferring power received by a load from a preferred AC power source to an alternate AC power source, or transferring power being received by the load from the alternate AC power source to the preferred AC power source, the shared transfer switching system comprising:

one first primary relay and one first secondary relay coupled in series, and also in series with the preferred power source and the load, to enable the load to be powered by the preferred power source;

one second primary relay and one second secondary relay coupled in series, and also in series with the alternate power source and with the load, for providing power from the alternate power source to the load when the preferred power source is not available to power the load;

a voltage sensing resistor string (VSRS) coupled across the second secondary relay;

a controller for controlling operation of the first and second primary relays and the first and second secondary relays;

a switching subsystem in communication with the controller and the first and second primary relays and the first and second secondary relays, the switching subsystem configured to be controlled by the controller to control a switch over from one or the other of the preferred or alternate power sources to the load; and a relay test subsystem including a software module and a voltage detection subsystem, both controlled by the controller, for carrying out a relay test process including performing a plurality of voltage tests by:

while the first primary relay and the first secondary relay are closed, and while the second primary relay is open, selectively opening the second secondary relay, and using the alternate power source to help perform a first voltage test to obtain a first voltage measurement using the VSRS, without an interruption of power to the load, to verify that the second secondary relay has opened;

opening the second secondary relay without interrupting power to the load;

closing the second primary relay while the second secondary relay remains open, and while the first primary relay and the first secondary relay both remain closed, and using the VSRS to obtain a second voltage measurement, while using the power from the preferred power source and without interrupting power to the load, to verify that the second primary relay has successfully closed.

9. The system of claim 8, wherein the second primary relay and the second secondary relay are tested by the controller while the system is being powered by the preferred power source.

10. The system of claim 8, wherein the first primary relay and the first secondary relay are tested while the system is being powered by the alternate power source.

11. The system of claim 8,
wherein the controller uses the relay test software module to close the second primary relay while the second secondary relay is opened, and uses the voltage detection subsystem to measure a voltage at a node representing an intermediate series connection point between the second primary relay and the second secondary relay, while power is being provided by the preferred power source, to verify proper operation of the second primary relay.

12. The system of claim 8,
wherein the controller uses the relay test software module to close the first primary relay while the first secondary relay is open, and uses the voltage detection subsystem to measure a voltage at a node representing an intermediate series connection point between the first primary relay and the first secondary relay, while power is being provided by the alternate power source, to verify proper operation of the first primary relay.

13. The system of claim 8, further comprising a user accessible control for initiating the relay test process.

14. The system of claim 13, further comprising a user interface subsystem, and wherein the user accessible control includes a button operably associated with the user interface subsystem, for enabling user initiation of the relay test process.

15. A method for testing a plurality of relays associated with a system for transferring power from one or the other of a preferred AC power source or an alternate power source to a load, the method comprising:
   using one first primary relay and one first secondary relay coupled in series, and in series with the preferred power source and the load, to enable the load to be powered by the preferred power source;
   using one second primary relay and one second secondary relay coupled in series, and also in series with the alternate power source and with the load, for providing power from the alternate power source to the load when the preferred power source is not available to power the load;
   a voltage sensing resistor string (VSRS) coupled across the second secondary relay;
   using a switching subsystem in communication with the first primary relay, the first secondary relay, the second primary relay, and the second secondary relay, and the load, the switching subsystem configured to be controlled to switch over from one or the other of the preferred or alternate power sources to the load; and
   carrying out a relay test process controlled by the controller, the relay test process including performing a plurality of voltage tests by:
      while the first primary relay and the first secondary relay are both closed, and the second primary relay is open, selectively opening the second secondary relay and using the alternate power source, along with the VSRS, to perform a first voltage measurement to verify that the second secondary relay has moved into an open position, and without an interruption of power to the load;
      opening the second secondary relay without interrupting power to the load;
      closing the second primary relay while the second secondary relay remains open, and while the first primary relay and the first secondary relay both remain closed, and using the VSRS to obtain a second voltage measurement, while using the power from the preferred power source and without interrupting power to the load, to verify that the second primary relay has successfully closed.

16. The method of claim 15, further comprising performing the first voltage measurement at a node defining an intermediate point between a series connection of the second primary relay and the second secondary relay; and
   subsequently performing the second voltage measurement at the node after the second primary relay has been opened and the second secondary relay has been closed.

* * * * *